US011367746B2

(12) United States Patent
Heikkinen et al.

(10) Patent No.: US 11,367,746 B2
(45) Date of Patent: Jun. 21, 2022

(54) RADIATION SENSOR ELEMENT AND METHOD

(71) Applicant: DETECTION TECHNOLOGY OYJ, Oulu (FI)

(72) Inventors: Petteri Heikkinen, Oulu (FI); Mikael Johansson, Oulu (FI)

(73) Assignee: DETECTION TECHNOLOGY OYJ, Oulu (FI)

( * ) Notice: Subject to any disclaimer, the term of this patent is extended or adjusted under 35 U.S.C. 154(b) by 0 days.

(21) Appl. No.: 17/593,967

(22) PCT Filed: Mar. 30, 2020

(86) PCT No.: PCT/FI2020/050206
§ 371 (c)(1),
(2) Date: Sep. 29, 2021

(87) PCT Pub. No.: WO2020/201626
PCT Pub. Date: Oct. 8, 2020

(65) Prior Publication Data
US 2022/0149104 A1    May 12, 2022

(30) Foreign Application Priority Data

Apr. 1, 2019  (EP) .................................... 19166459

(51) Int. Cl.
*H01L 27/146* (2006.01)
*H01L 23/00* (2006.01)

(52) U.S. Cl.
CPC ........ *H01L 27/14636* (2013.01); *H01L 24/03* (2013.01); *H01L 27/1464* (2013.01); *H01L 2224/05647* (2013.01)

(58) Field of Classification Search
CPC ............... H01L 27/14636; H01L 24/03; H01L 27/1464; H01L 2224/05647
See application file for complete search history.

(56) References Cited

U.S. PATENT DOCUMENTS

2015/0333093 A1* 11/2015 Ting .................. H01L 27/14634
438/66
2016/0148965 A1   5/2016 Clayton
(Continued)

OTHER PUBLICATIONS

International Search Report for PCT/F12020/050206 (ISA/EP) dated May 15, 2020 (2 pages).
(Continued)

*Primary Examiner* — Thanh T Nguyen
(74) *Attorney, Agent, or Firm* — Alston & Bird LLP

(57) ABSTRACT

A radiation sensor element comprises a support plate, having a front face, extending substantially along a base plane, defining a lateral extension of the radiation sensor element; a substrate, having a basal face, an interconnection face opposite the basal face, and an edge face connecting the basal face and the interconnection face; a sensor tile, having a back face facing the interconnection face; a copper-pillar interconnection element between the interconnection face and the back face; and a non-conductive film extending between the interconnection face and the back face. The front face comprises, laterally beyond the edge face, a depression extending in a thickness direction perpendicular to the base plane, and the non-conductive film comprises an edge protrusion part extending in the depression.

15 Claims, 2 Drawing Sheets

(56) References Cited

U.S. PATENT DOCUMENTS

2016/0218072 A1* 7/2016 Liao .................. H01L 23/66
2017/0345863 A1* 11/2017 Hori ................ H01L 27/14687
2018/0337142 A1* 11/2018 Cheng ................ H01L 23/04
2019/0013347 A1   1/2019 Kobayashi

OTHER PUBLICATIONS

Written Opinion for International Application No. PCT/FI2020/050206 (ISA/EP) dated May 15, 2020 (5 pages).
Extended European Search Report for EP Application No. 19166459.8 dated Jul. 11, 2019 (5 pages).

* cited by examiner

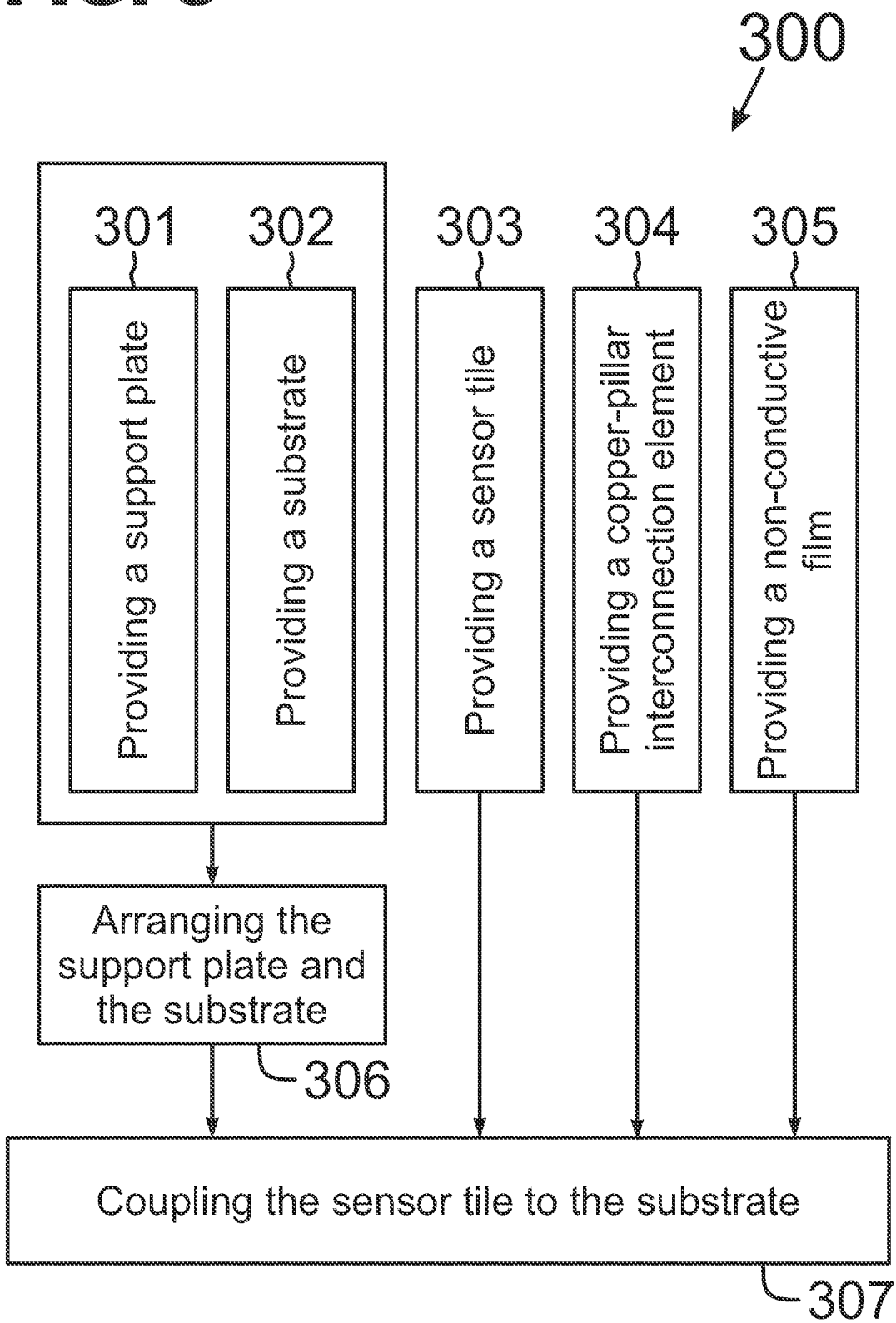

RADIATION SENSOR ELEMENT AND METHOD

CROSS-REFERENCE TO RELATED APPLICATIONS

The present application is a national phase entry of International Application No. PCT/FI2020/050206, filed Mar. 30, 2020, which claims priority to European Patent Application No. 19166459.8, filed Apr. 1, 2019, which are incorporated herein by reference in their entirety.

FIELD OF TECHNOLOGY

The invention concerns the technology of radiation detectors. In particular, the invention concerns back-end processing for radiation detectors.

BACKGROUND

Radiation detectors are widely used for detecting ionizing radiation in experimental and applied particle and nuclear physics, as well as in the medical and environmental fields. Radiation detectors may also be used, for example, in various safety and military applications.

One of the most advantageous types of radiation detectors are so-called solid-state detectors, i.e., semiconductor detectors. Such detectors may generally provide improved ease of use, longer lifecycle, smaller size, as well as higher resolution and sensitivity compared to other types of radiation sensors.

However, back-end processing may prove challenging for solid-state sensor elements. Such challenges may be related, for example, to high resolution and layout density levels required of modern devices. In light of this, it may be desirable to develop new solutions related to back-end processing of solid-state sensor elements.

SUMMARY

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to a first aspect, a radiation sensor element is provided. The radiation sensor element comprises a support plate, having a front face, extending substantially along a base plane, defining a lateral extension of the radiation sensor element; a substrate, having a basal face facing the front face, an interconnection face opposite the basal face, and an edge face connecting the basal face and the interconnection face; a sensor tile, comprising an active material layer and having a back face facing the interconnection face; a copper-pillar interconnection element between the interconnection face and the back face; and a non-conductive film extending between the interconnection face and the back face and laterally surrounding the copper-pillar interconnection element.

The front face comprises, laterally beyond the edge face, a depression extending in a thickness direction perpendicular to the base plane, and the non-conductive film comprises, laterally beyond the edge face, an edge protrusion part extending in the depression.

According to a second aspect, a method for fabricating a radiation sensor element is provided. The method comprises providing a support plate, having a front face, extending substantially along a base plane, defining a lateral extension of the radiation sensor element, the front face comprising a depression, extending in a thickness direction perpendicular to the base plane; providing a substrate, having a basal face, an interconnection face opposite the basal face, and an edge face connecting the basal face and the interconnection face; providing a sensor tile, comprising an active material layer and having a back face; providing a copper-pillar interconnection element; providing a non-conductive film; arranging the support plate and the substrate such that the basal face faces the front face and the depression is arranged laterally beyond the edge face; and coupling the sensor tile to the substrate such that the back face faces the interconnection face, the non-conductive film extends between the interconnection face and the back face, the copper-pillar interconnection element is arranged between the interconnection face and the back face, and the non-conductive film laterally surrounds the copper-pillar interconnection element, whereby an edge protrusion part of the non-conductive film, extending in the depression, is formed.

BRIEF DESCRIPTION OF THE DRAWINGS

The present disclosure will be better understood from the following Detailed Description read in light of the accompanying drawings, wherein:

FIG. 3 illustrates a flow chart of a method for fabricating a radiation sensor element.

Figure 1:
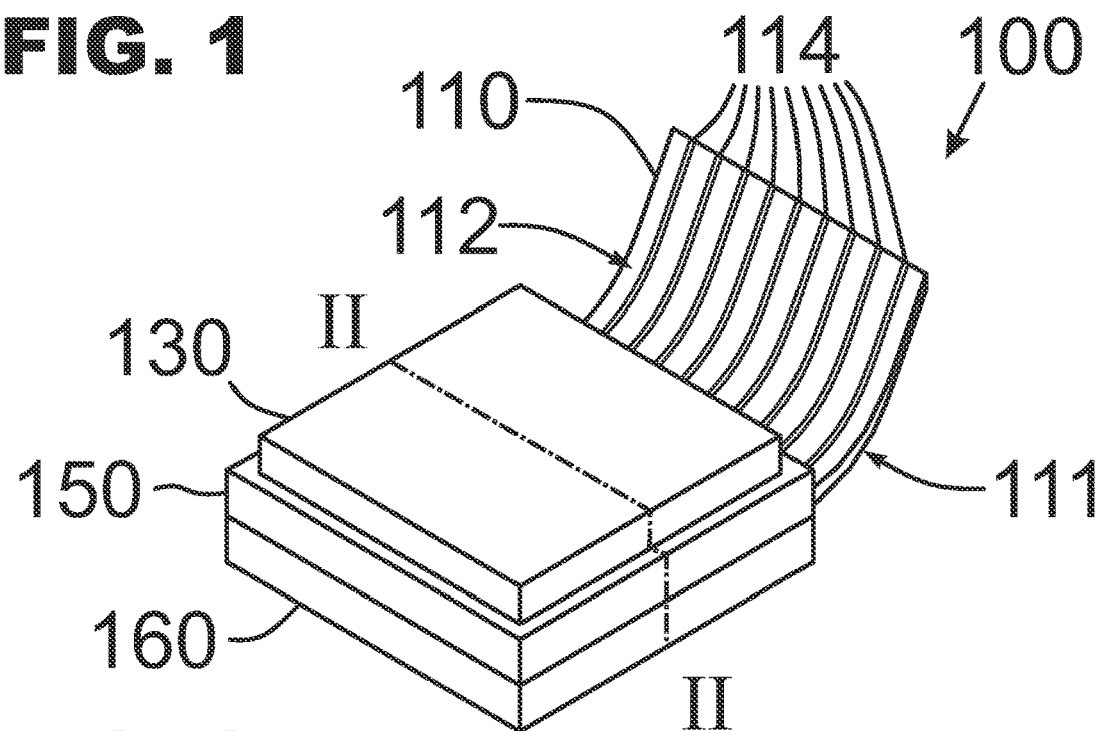
FIG. 1 depicts a schematic, isometric view of a radiation sensor element.

Unless specifically stated to the contrary, any drawing of the aforementioned drawings may be not drawn to scale such that any element in said drawing may be drawn with inaccurate proportions with respect to other elements in said drawing in order to emphasize certain structural aspects of the embodiment of said drawing.

Moreover, corresponding elements in the embodiment(s) of any two drawings of the aforementioned drawings may be disproportionate to each other in said two drawings in order to emphasize certain structural aspects of the embodiment(s) of said two drawings.

DETAILED DESCRIPTION

Concerning radiation sensor elements and methods discussed in this Detailed Description, the following shall be noted.

Herein, "radiation" is to be understood broadly, covering, for example, electromagnetic radiation and particle radiation. Radiation may generally correspond to ionizing radiation or non-ionizing radiation.

In this specification, "ionizing" radiation may refer to radiation with particle or photon energies less than 10 electron volts (eV), whereas "non-ionizing" radiation may refer to radiation with particle or photon energies of at least 10 eV.

Throughout this specification, a "radiation detector" may refer to a complete, operable radiation detector. A radiation detector may generally comprise at least one radiation sensor. A radiation detector may comprise also other elements, units, and/or structures.

In this disclosure, a "radiation sensor" may refer to an operable unit, module, or device configured to detect and/or measure radiation and to register, indicate, and/or respond to said radiation.

Further, a "radiation sensor element" may refer to an element, which may form, as such, a radiation sensor. Alternatively, a radiation sensor element may be used as one element of a radiation sensor comprising also other elements and/or structures. A radiation sensor element may comprise an active material, a physical property of which is utilized in said radiation sensor element in order to register, indicate, and/or respond to radiation incident on said active material. A radiation sensor element may correspond to an indirect-conversion radiation sensor element or a direct-conversion radiation sensor element.

Throughout this disclosure, an "indirect-conversion radiation sensor element" may refer to a radiation sensor element comprising a scintillator material for converting ionizing radiation to non-ionizing electromagnetic radiation and semiconductor material as active material for detecting the electromagnetic radiation emitted by the scintillator.

Herein, a "semiconductor" material may refer to a material possessing a conductivity intermediate between the conductivity of conductive materials, such as metals, and the conductivity of insulating materials, such as many plastics and glasses. A semiconductor material may generally have a doping level, which may be adjusted in order to tune properties of said semiconductor material in a controllable manner.

By contrast, a "direct-conversion radiation sensor element" may refer to a radiation sensor element not requiring the use of a scintillator to convert ionizing radiation to non-ionizing electromagnetic radiation in order to detect said ionizing radiation. Such direct-conversion radiation sensor elements may be based on detecting free charge carriers produced by incident radiation, e.g., ionizing radiation, within an active material. A direct-conversion radiation sensor element may generally comprise a compound semiconductor material as an active material.

Herein, a "compound semiconductor" may refer to a semiconductor compound comprising at least two different chemical elements. A compound semiconductor material may correspond, for example, to a binary, a ternary, or a quaternary compound. Some compound semiconductor materials, or material systems, may exhibit highly tunable properties based on an elemental composition thereof. One example of such tunable compound semiconductor material system is cadmium zinc telluride (CdZnTe), an alloy of cadmium telluride (CdTe) and zinc telluride (ZnTe).

Figure 2:
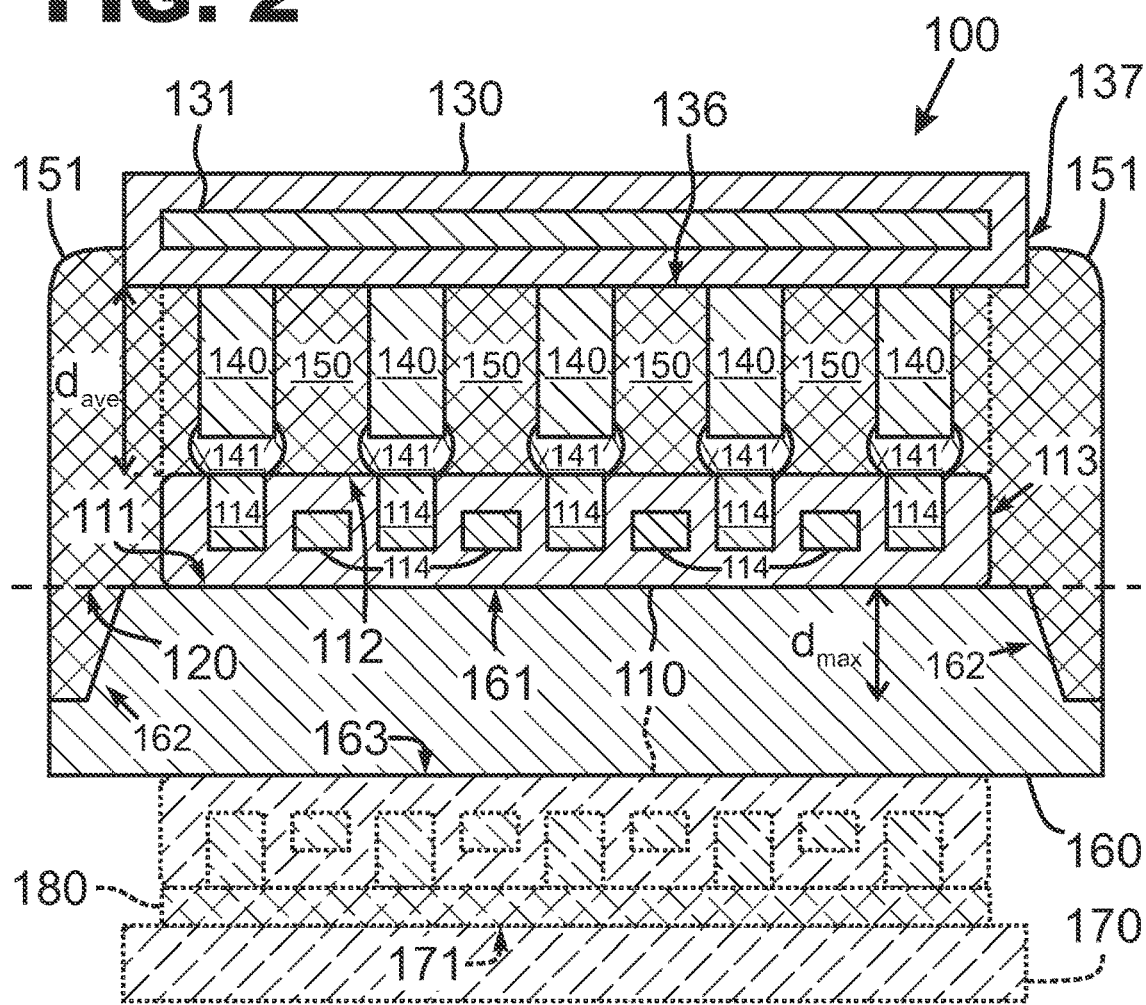
FIG. 2 shows a schematic, cross-sectional view of the same radiation sensor element along a cross-sectional plane extending along the dash-dotted line II-II of FIG. 1.

FIGS. 1 and 2 depict a radiation sensor element 100 according to an embodiment. In particular, FIG. 2 depicts a cross-sectional view of the radiation sensor element 100 along a cross-sectional plane extending along the dash-dotted line II-II of FIG. 1. Since FIG. 2 depicts a cross section of the radiation sensor element 100, FIG. 2 does not limit shapes of the embodiment of FIGS. 1 and 2 or any part(s) thereof in any direction forming an angle with the cross-sectional plane extending along the line II-II of FIG. 1.

In the embodiment of FIGS. 1 and 2, the radiation sensor element 100 comprises a support plate 160. Although only a single support plate 160 is depicted in FIGS. 1 and 2, a radiation sensor element may generally comprise any suitable number of support plates.

In this disclosure, a "support plate" may refer to a generally plate-shaped body suitable for or configured to mechanically strengthen an element or device. Additionally or alternatively, a support plate may act as a frame onto which other elements and/or structures may be mounted or fixed. A support plate may generally comprise a metal. A support plate comprising a metal may generally act as a heat sink and/or a radiation shield for other elements and/or structures.

In the embodiment of FIGS. 1 and 2, the support plate 160 comprises a front face 161, extending substantially along a base plane 120 defining a lateral extension of the radiation sensor element 100. In other embodiments, a support plate may generally comprise such front face.

Herein, a "face" may refer to a part of a surface of a body or an element. A face may specifically refer to a part of a surface of a body or an element viewable from a particular viewing direction, or a part thereof. A face of a body or an element may or may not have a pre-defined function in the operation of said body or said element.

The base plane 120 of the embodiment of FIGS. 1 and 2 is planar. In other embodiments, a support plate may be planar or curved, having a front face, extending substantially along a curved base plane.

The support plate 160 of the embodiment of FIGS. 1 and 2 also has a rear face 163 opposite the front face 161. In other embodiments, a support plate 160 may or may not have such rear face.

In the embodiment of FIGS. 1 and 2, a projection of the support plate 160 on the base plane 120 has a substantially square shape. Generally, such shape of a support plate may facilitate arranging a plurality of sensor tiles in close proximity to one another. In other embodiments, a projection of a support plate on a base plane may have any suitable shape, for example, a square, rectangular, or other polygonal shape, or a curvilinear, such as a circular or elliptic, shape.

In the embodiment of FIGS. 1 and 2, the radiation sensor element 100 comprises a substrate 110. Although only a single substrate 110 is depicted in FIGS. 1 and 2, a radiation sensor element may generally comprise any suitable number of substrates.

Throughout this specification, a "substrate" may refer to a layer or other element or structure suitable for or configured to provide a surface whereon other layers or other elements or structures may be bonded, mounted, arranged, deposited, laminated, and/or fabricated. A substrate may comprise, for example, a semiconductor wafer or die and/or an electrical circuit board.

In the embodiment of FIGS. 1 and 2, the substrate 110 comprises a basal face 111 facing the front face 161. In other embodiments, a substrate may generally have such basal face.

The basal face 111 of the embodiment of FIGS. 1 and 2 extends substantially along the base plane 120. Further, the basal face is directly connected to the front face 161 of the support plate 160. In other embodiments, a basal face may or may not extend substantially along a base plane. In said other embodiments, said basal face may or may not be directly connected to a front face of a support plate.

The substrate 110 of the embodiment of FIGS. 1 and 2 has an interconnection face 112 opposite the basal face 111. In other embodiments, a substrate may generally have such interconnection face.

Throughout this specification, an "interconnection face" may refer to a face of a body or an element configured to or suitable for electrically coupling said body or element to another body or element. In particular, an interconnection face of a substrate of a radiation sensor element may refer to a face of said substrate configured to or suitable for electrically coupling said substrate to active material of said radiation sensor element.

The substrate 110 of the embodiment of FIGS. 1 and 2 also has an edge face 113 connecting the basal face 111 and the interconnection face 112. In other embodiments, a substrate may generally have such edge face.

Herein, an "edge face" may refer to a face of a substrate connecting a basal face and an interconnection face of said substrate. As such, an edge face may generally extend from a basal face to an interconnection face.

In the embodiment of FIGS. 1 and 2, the substrate 110 comprises a flex circuit. Generally, a substrate comprising a flex circuit may provide compliance to height and/or planarity variations during fabrication of a radiation sensor element. Additionally or alternatively, a substrate comprising a flex circuit may enable or facilitate increasing a distance between active material of a radiation sensor element and electrical circuitry suitable or configured for processing signals originating form said active material. In other embodiments, a substrate may or may not comprise a flex circuit.

Herein, a "flex circuit" may refer to an electrical circuit board that is at least partly flexible, foldable, bendable, pliable, and/or rollable. A flex circuit may or may not have electrical components attached thereto. A flex circuit may comprise, for example, a flat base film, one or more conductor patterns, e.g., metallic patterns, bonded to a face of said base film, and optionally a thin coating layer on said conductor patterns for mechanical protection and/or electrical isolation. A flex circuit may correspond, for example, to a single-sided flex circuit, double-sided flex circuit, double-access flex circuit, multilayer flex circuit, sculptured flex circuit, rigid-flex circuit, or a polymer thick film flex circuit.

The flex circuit of the embodiment of FIGS. 1 and 2 comprises a plurality of conductor traces 114. In other embodiments, wherein a substrate comprises a flex circuit, said flex circuit may comprise one or more conductor traces and/or other types of conductor patterns.

Although no parts of the substrate 110 of the embodiment of FIGS. 1 and 2 other than the flex circuit are depicted in FIG. 1 or 2, a substrate of a radiation sensor element may generally comprise any suitable elements in addition to or in lieu of a flex circuit.

In the embodiment of FIGS. 1 and 2, the radiation sensor element 100 comprises a sensor tile 130. Although only a single sensor tile 130 is depicted in FIGS. 1 and 2, a radiation sensor element may generally comprise any suitable number of sensor tiles.

Herein, a "sensor tile" may refer to a part of a radiation sensor element comprising active material(s). A sensor tile may or may not additionally comprise electronic devices configured to register, process, and/or transmit electrical signals from said active material(s). A sensor tile may or may not have a generally sheet-shaped form.

The sensor tile 130 of the embodiment of FIGS. 1 and 2 is arranged on a radiation-receiving side of the base plane 120. In other embodiments, a sensor tile may or may not be arranged on a radiation-receiving side of a base plane.

Throughout this specification, a "radiation-receiving side" may refer to a side of a radiation sensor element or a base plane thereof wherefrom radiation to be detected using said radiation sensor element may be incident on said radiation sensor element. Additionally or alternatively, a radiation sensor element may generally be configured for detecting radiation incident on said radiation sensor element from a radiation-receiving side thereof. Additionally or alternatively, a radiation-receiving side of a base plane may refer to a side of said base plane wherein a sensor tile is arranged.

In the embodiment of FIGS. 1 and 2, a projection of the sensor tile 130 on the base plane 120 has a substantially square shape. Generally, a plurality of sensor tiles with such shapes may be arranged in a four-side buttable manner. In other embodiments, a projection of a sensor tile on a base plane may have any suitable shape, for example, a square, rectangular, or other polygonal shape, or a curvilinear, such as a circular or elliptic, shape.

The sensor tile 130 of the embodiment of FIGS. 1 and 2 comprises an active material layer 131, as shown schematically in FIG. 2. In other embodiments, a sensor tile may generally comprise an active material layer.

In this disclosure, a "layer" may refer to a generally sheet-shaped element arranged on a surface or a body. Additionally or alternatively, a layer may refer to one of a series of superimposed, overlaid, or stacked generally sheet-shaped elements. A layer may generally comprise a plurality of sublayers of different materials or material compositions. Some layers may be path-connected, whereas other layers may be locally path-connected and disconnected.

As such, an "active material layer" may refer to a layer comprising an active material of a radiation sensor element. An active material layer may generally comprise any suitable active material(s), such as semiconductor material(s), e.g., CdTe, CdZnTe, cadmium manganese telluride (CdMnTe), silicon (Si), germanium (Ge), and/or diamond.

The active material layer 131 of the embodiment of FIGS. 1 and 2 comprises Si as an active material. In other embodiments, an active material layer may comprise Si and/or any other suitable active material(s).

Although omitted from FIG. 1 or 2, an active material layer, such as the active material layer 131 of the embodiment of FIGS. 1 and 2, may be supplied with a bias voltage for collecting and/or detecting electrical charge(s) brought about by incident radiation. Additionally, some radiation sensor elements may comprise a scintillator coupled to an active material layer for converting energy of incident radiation to electromagnetic radiation detectable using said active material layer. Such scintillators may be unnecessary in case of direct-conversion sensor elements.

In the embodiment of FIGS. 1 and 2, the sensor tile 130 has a back face 136 facing the interconnection face 112 of the substrate 110. In other embodiments, a sensor tile may generally have a back face facing an interconnection face.

Throughout this specification, a "back face" may refer to a face of a sensor tile facing an interconnection face of a substrate. Additionally or alternatively, a back face may refer to a face of a sensor tile on a side opposite a radiation-receiving side of said sensor tile. Generally, a back face may or may not comprise any suitable additional structural feature(s), such as an interconnection pad, for enabling or facilitating provision of an electrical connection between a sensor tile and a substrate.

In the embodiment of FIGS. 1 and 2, the sensor tile 130 also has a lateral face 137 extending substantially along the thickness direction from the back face 136.

In particular, the lateral face 137 extends from the back face 136 towards the radiation-receiving side of the radiation sensor element 100. In other embodiments, a sensor tile may or may not comprise such lateral face. In embodiments, wherein a sensor tile has such lateral face, said lateral face may or may not extend from a back face towards a radiation-receiving side of a radiation sensor element.

In this disclosure, a "lateral face" may refer to a face of a sensor tile extending substantially along a thickness direction of a radiation sensor element from a back face of said sensor tile. Additionally or alternatively, a lateral face may refer to a face of a sensor tile extending from a back face thereof towards a radiation-receiving side of a radiation sensor element and/or a sensor tile.

Although the lateral face 137 of the embodiment of FIGS. 1 and 2 is depicted as a single surface extending perpendicularly to the base plane 120, a lateral face may generally comprise one or more surfaces, which may be planar, substantially planar, and/or curved.

The radiation sensor element 100 of the embodiment of FIGS. 1 and 2 comprises a plurality of copper-pillar interconnection elements 140 between the interconnection face 112 and the back face 136. Such copper-pillar interconnection elements may possess increased mechanical rigidity, facilitating penetration of said copper-pillar interconnection elements through viscous material(s) during fabrication of a radiation sensor element. Additionally or alternatively, such increased mechanical rigidity may facilitate controlling material overflows during fabrication by limiting advancement of a sensor tile towards a substrate during fabrication of a radiation sensor element. In other embodiments, a radiation sensor element may comprise one or more copper-pillar interconnection element(s) between an interconnection face and a back face.

Herein, a "copper-pillar interconnection element" may refer to an interconnection element comprising (metallic) copper (Cu) and having a generally pillar-shaped and/or protruding form. Generally, a copper-pillar interconnection element may or may not have a rotationally symmetric shape. In particular, a copper-pillar interconnection element may or may not have a cylindrical shape. A copper-pillar interconnection element may have any suitable height in a height direction perpendicular to an interconnection face and/or a back face, for example, a height in a range from a few micrometers to some tens of micrometers. A copper-pillar interconnection element may also have any suitable width, such as a diameter, in a lateral direction perpendicular to a height direction, for example, a width in a range from a few micrometers to some tens of micrometers.

A copper-pillar interconnection element may generally be provided by any suitable means or processes. As such, a process of providing a copper-pillar interconnection element may comprise, for example, a photolithography step, an electroplating step, and/or an electroless plating step.

The copper-pillar interconnection elements 140 of the embodiment of FIGS. 1 and 2 extend from the back face 136 towards the interconnection face 112. In particular, the copper-pillar interconnection elements 140 are in direct electrical contact with both the sensor tile 130 and the substrate 110. In other embodiments, a copper-pillar interconnection element may extend between an interconnection face and a back face in any suitable manner, for example, from said interconnection face towards said back face and/or from said back face towards said interconnection face.

In said other embodiments, intermediate layers and/or other elements may or may not exist between said copper-pillar interconnection element and said interconnection face and/or between said copper-pillar interconnection element and said back face. As such, a copper-pillar interconnection element may be in electrical contact with a substrate and/or a sensor tile directly or indirectly. Such intermediate layers and/or other elements may be configured to improve adhesion, to prevent diffusion-related effects, and/or to reduce electrical resistance between said copper-pillar interconnection element and said interconnection face and/or between said copper-pillar interconnection element and said back face.

In the embodiment of FIGS. 1 and 2, each of the copper-pillar interconnection elements 140 comprises a solder tip 141. Such solder tip(s) may generally provide compliance to height variations in copper-pillar interconnection elements and/or to planarity variations in sensor tiles and/or read-out integrated circuits. Additionally or alternatively, such solder tip(s) may facilitate adjusting fabrication parameters (e.g., temperatures and/or compression pressures) to suitable levels during fabrication of a radiation sensor element. In other embodiments, a copper-pillar interconnection element may or may not comprise a solder tip.

Throughout this specification, "solder" may refer to fusible metal suitable for coupling or bonding metal elements by melting and freezing said solder. A solder may comprise any suitable material(s), for example, indium (In), tin (Sn), bismuth (Bi), silver (Ag), lead (Pb), and/or zinc (Zn).

Consequently, a "solder tip" may refer to a structure or part, arranged at an end of an object and comprising solder. Specifically, a solder tip of a copper-pillar interconnection element may refer to such structure or part arranged at an end of said copper-pillar interconnection element.

A solder tip of a copper-pillar interconnection element may generally be provided by any suitable means or processes. As such, a process of providing a copper-pillar interconnection element may comprise a process of providing a solder tip for said copper-pillar interconnection element, which may comprise, for example, an electroplating step.

The solder tips 141 of the embodiment of FIGS. 1 and 2 are arranged at ends of the copper-pillar interconnection elements 140 closer to the interconnection face 112 than to the back face 136. In other embodiments, solder tip(s) may be arranged at any end(s) of a copper-pillar interconnection element, for example, at an end closer to an interconnection face than to a back face.

The solder tips 141 of the embodiment of FIGS. 1 and 2 comprise low-temperature solder. Such solder tip comprising low-temperature solder may facilitate usage of lower process temperatures during fabrication of a radiation sensor element, which may facilitate controlling material overflows during fabrication by increasing dynamic viscosities of relevant material(s). Additionally or alternatively, such solder tip comprising low-temperature solder may facilitate fabrication of a radiation sensor element comprising a sensor tile with temperature-sensitive active material(s), such as compound semiconductor material(s). In other embodiments, wherein a copper-pillar interconnection element comprises a solder tip, said solder tip may comprise any suitable solder, e.g., low-temperature solder.

Herein, "low-temperature solder" may refer to solder having a liquidus and/or a solidus temperature of less than 200° C., or less than 170° C., or less than 140° C.

Each of the solder tips 141 of the embodiment of FIGS. 1 and 2 forms a part of an electrical conduction path connecting the substrate 110 and the sensor tile 130. In other words, a plurality of galvanic connections, passing via the copper-pillar interconnection elements 140, exists between the substrate 110 and the sensor tile 130. Although a radiation sensor element may or may not comprise a galvanic connection between a substrate and a sensor tile, such galvanic connection(s) may generally be provided in an operable radiation detector.

Throughout this disclosure, a "galvanic connection" may refer to an electrical connection between elements that enables a constant flow of direct (i.e., unidirectional) electrical current between said elements. A galvanic contact may refer to an electrical connection between two solid elements that provides an electrical direct current path passing through solid matter only.

In the embodiment of FIGS. 1 and 2, the radiation sensor element 100 comprises a non-conductive film 150 extending between the interconnection face 112 and the back face 136. Such non-conductive film may generally improve mechanical stability of a radiation sensor element and/or reduce a probability of electrical breakdown, i.e., sparking, during operation of said radiation sensor element. In other embodiments, a radiation sensor element may generally comprise such non-conductive film.

In this specification, a "non-conductive film" may refer to a layer arranged between an interconnection face and a back face. A non-conductive film may generally exhibit low average electrical conductivity, for example, an average electrical conductivity of less than 10 S/m, or less than 1 S/m, or less than 0.1 S/m, or less than 0.01 S/m at 20° C. A non-conductive film may comprise any suitable electrically insulating adhesive material(s), such as, varnish(es), resin(s), and/or silicone. A non-conductive film may or may not comprise a thermoplastic electrically insulating adhesive material and/or a thermosetting electrically insulating adhesive material, such as epoxy resin. Electrically insulating adhesive may or may not further comprise pieces of insulating material(s), for example, ceramic and/or silica particles, embedded in said electrically insulating adhesive material(s). A non-conductive film may or may not be arranged onto a surface at least partly by a lamination process.

Although the non-conductive film 150 of the embodiment of FIGS. 1 and 2 is depicted as a plurality of separate sections in the cross-sectional view of FIG. 2, the non-conductive film 150 forms a single, continuous (e.g., path-connected) element. In other embodiments, a radiation sensor element may comprise any suitable number of non-conductive films, for example, one, two, three, or more.

The non-conductive film 150 of the embodiment of FIGS. 1 and 2 laterally surrounds the copper-pillar interconnection elements 140. In other embodiments, a non-conductive film may generally laterally surround one or more copper-pillar interconnection elements.

The non-conductive film 150 of the embodiment of FIGS. 1 and 2 may comprise thermosetting electrically insulating adhesive material. Consequently, the non-conductive film 150 may be a thermosetting non-conductive film. In other embodiments, a non-conductive film may or may not comprise thermosetting electrically insulating adhesive material.

In the embodiment of FIGS. 1 and 2, the front face 161 of the support plate 160 comprises, laterally beyond the edge face 113 of the substrate 110, a depression 162 extending in a thickness direction perpendicular to the base plane 120. In other embodiments, a front face of a support plate may generally comprise such depression.

Throughout this specification, a "depression" may refer to a sunken part of or a hollow on face or a surface. A depression may generally comprise, for example, a pit, groove, and/or an edge profile, e.g., a bevel, a chamfer, or a step. Specifically, a depression of a front face of a support plate may have a depth, which may be measured perpendicular to and from a base plane.

In the embodiment of FIGS. 1 and 2, the depression 162 comprises a stepped edge profile. In particular, the depression 162 comprises a single-step edge profile. In other embodiments, a depression may comprise any suitable features, which may have a depth measurable perpendicular to and from a base plane.

The single-step edge profile of the depression 162 of the embodiment of has a trapezoidal cross section along the cross-sectional plane of FIG. 2, extending along the dash-dotted line II-II of FIG. 1. In other embodiments, a depression, such as an edge profile, may have any suitable cross-sectional shape(s), for example, a rectangular (e.g., square), parallelogram, trapezoidal, or curvilinear shape.

In the embodiment of FIG. 4, the front face 161 of the support plate 160 comprises a single depression 162. In other embodiments, a front face of a support plate may comprise any suitable number of depressions, for example, one, two, three, or more.

In the embodiment of FIGS. 1 and 2, the non-conductive film 150 comprises an edge protrusion part 151 laterally beyond the edge face 113. Such edge protrusion part may be formed, for example, due to flow of electrically insulating adhesive material(s) in a non-conductive film during fabrication of a radiation sensor element. In some cases, certain types of edge protrusion parts may hinder arranging a plurality of sensor tiles in close proximity to one another. In other embodiments, a non-conductive film may generally comprise an edge protrusion part.

Although the edge protrusion part 151 of the embodiment of FIGS. 1 and 2 is depicted as two separate sections in the cross-sectional view of FIG. 2, the edge protrusion part 151 forms a single, continuous (e.g., path-connected) structure. In other embodiments, a non-conductive film may comprise any suitable number of such edge protrusion parts, for example, one, two, three, or more.

Herein, an "edge protrusion part" may refer to a part of a non-conductive film laterally beyond an edge face of a substrate. Additionally or alternatively, an edge protrusion part may refer to a part of a non-conductive film extending at and/or along lateral edges thereof. Additionally or alternatively, an edge protrusion part may refer to a part of a non-conductive film, having a projection on a base plane disjoint, i.e., non-overlapping, with and outside of an intersection of a projection of an interconnection face on said base plane and a projection of a back face on said base plane.

The edge protrusion part 151 of the embodiment of FIGS. 1 and 2 has a projection on the base plane 120 disjoint with and outside of an intersection of projections of the interconnection face 112 and the back face 136 on the base plane 120. In other embodiments, an edge protrusion part may or may not have a projection on a base plane disjoint with and outside of an intersection, and optionally a union, of projections of an interconnection face and a back face on a base plane.

The edge protrusion part 151 of the embodiment of FIGS. 1 and 2 extends in the depression 162. An edge protrusion part of a non-conductive film extending in a depression of a front face of a support plate may generally reduce lateral spread of said non-conductive film during fabrication of a radiation sensor element, which in turn may enable arranging a plurality of sensor tiles closer to one another. In other embodiments, a radiation sensor element may generally comprise a non-conductive film, comprising an edge protrusion part extending in a depression of a front face of a support plate of said radiation sensor element.

The depression 162 of the embodiment of FIGS. 1 and 2 has a maximum depth $d_{max}$, and the interconnection face 112 and the back face 136 have an average distance $d_{ave}$ between one another. In the embodiment of FIGS. 1 and 2, a ratio between $d_{max}$ and $d_{ave}$ is at least 0.5. Such ratio may generally enable reducing lateral spread of a non-conductive film considerably during fabrication of a radiation sensor element. In other embodiments, any suitable ratio, for example, a ratio of at least 0.5, or at least 1, or at least 1.5, may exist between a maximum depth of a depression and an average distance between an interconnection face and a back face.

As depicted using dotted lines and dashed hatching in FIG. 2, the radiation sensor element 100 of the embodiment of FIGS. 1 and 2 may further comprise a read-out integrated circuit 170. Such read-out integrated circuit may generally facilitate detecting radiation in a pixel-wise manner. Additionally or alternatively, such read-out integrated circuit may improve a signal-to-noise ratio of electrical signals detected using a radiation sensor element. In other embodiments, a radiation sensor element may or may not comprise such read-out integrated circuit.

In this disclosure, an "integrated circuit" may refer to a body or an element comprising electrical circuitry formed on a piece of semiconductor material, such as Si.

As such, a "read-out integrated circuit" may refer to an integrated circuit configured to accumulate charge generated by incident radiation within an active material of a radiation sensor element. Additionally or alternatively, a read-out integrated circuit may refer to an integrated circuit configured to move such charge away from said active material for further processing. A read-out integrated circuit may generally be configured to operate in a pixel-wise manner.

In a practical application, a read-out integrated circuit may comprise various technical features related, for example, to design of individual semiconductor devices, isolation of individual devices, and/or internal electrical connections between individual devices. Such features are, however, omitted for brevity and conciseness.

The read-out integrated circuit 170 of the embodiment of FIGS. 1 and 2 may be coupled with the substrate 110. In other embodiments, a read-out integrated circuit may or may not be coupled to a substrate.

In the embodiment of FIGS. 1 and 2, the radiation sensor element 100 may further comprise an interconnection layer 180 between the substrate 110 and the read-out integrated circuit 170. In other embodiments, a radiation sensor element may or may not comprise such interconnection layer.

In this disclosure, an "interconnection layer" may refer to a layer configured to mediate electrical current between two structures or elements. Consequently, an interconnection layer between a substrate and a read-out integrated circuit may refer to a layer specifically configured to mediate electrical current between said substrate and said read-out integrated circuit. An interconnection layer may or may not comprise one or more interconnection elements.

Herein, an "interconnection element" may refer to an element via which electrical current may pass between two structures or elements.

The read-out integrated circuit 170 of the embodiment of FIGS. 1 and 2 may be in galvanic connection with the active material layer 131 of the sensor tile 130. In the embodiment of FIGS. 1 and 2, such galvanic connection may be formed, at least partly, via the interconnection layer 180, the substrate 110, and a copper-pillar interconnection element 140. Although a radiation sensor element may or may not comprise a galvanic connection between a read-out integrated circuit and an active material layer, such galvanic connection(s) may generally be provided in an operable radiation detector.

The read-out integrated circuit 170 of the embodiment of FIGS. 1 and 2 may have a first face 171 facing the rear face 163 of the support plate 160. Such arrangement of a read-out integrated circuit may reduce radiation exposure of said read-out integrated circuit during operation of a radiation detector. In other embodiments, wherein a radiation sensor element comprises a read-out integrated circuit, which may be coupled with a substrate, said read-out integrated circuit may or may not have a first face facing a rear face of a support plate.

In the embodiment on FIGS. 1 and 2, the first face 171 of the read-out integrated circuit 170 corresponds to a face of the read-out integrated circuit 170 via which the read-out integrated circuit 170 is in galvanic connection with the active material layer 131. In other embodiments, a first face of the read-out integrated circuit may correspond to any face thereof.

In the embodiment of FIGS. 1 and 2, the substrate 110 extends between the support plate 160 and the read-out integrated circuit 170. In other embodiments, a substrate may or may not extend between a support plate and a read-out integrated circuit. In some embodiments, for example, a read-out integrated circuit may be arranged between a support plate and a substrate.

In embodiments, wherein a read-out integrated circuit coupled with a substrate, which may comprise a flex circuit, and in galvanic connection with an active material layer has a first face facing a rear face of a support plate, a lateral extent of said support plate may be limited in at least one lateral direction to facilitate arrangement of a plurality of sensor tiles closer to one another.

It is to be understood that any of the preceding embodiments of the first aspect may be used in combination with each other. In other words, several of the embodiments may be combined together to form a further embodiment of the first aspect.

Above, mainly structural, and material aspects related to radiation sensor elements are discussed. In the following, more emphasis will lie on aspects related to methods for fabricating radiation sensor elements. What is said above about the ways of implementation, definitions, details, and advantages related to the structural and material aspects apply, mutatis mutandis, to the method aspects discussed below. The same applies vice versa.

It is specifically to be understood that a method according to the second aspect may be used to provide a radiation sensor element according to the first aspect and any number of embodiments described in relation to the first aspect. Correspondingly, any radiation sensor element according to any embodiment of the first aspect may be fabricated using a method according to the second aspect.

FIG. 3 illustrates a method 300 for fabricating a radiation sensor element according to an embodiment.

The method 300 of the embodiment of FIG. 3 comprises, in process 301, providing a support plate, having a front face, extending substantially along a base plane, the base plane defining a lateral extension of the radiation sensor element. The front face of the support plate comprises a depression, extending in a thickness direction perpendicular to the base plane.

In process 302, a substrate is provided, having a basal face, an interconnection face opposite the basal face, and an edge face connecting the basal face and the interconnection face.

A sensor tile is provided in process 303, the sensor tile comprising an active material layer and having a back face.

In process 304, a copper-pillar interconnection element is provided, and a non-conductive film is provided in process 305.

Any steps implementing one or more of the aforementioned processes 301, 302, 303, 304, 305 may generally be formed in various different orders. This is illustrated in FIG. 3 by the level arrangement of rectangular symbols representing said processes.

In process 306, the support plate and the substrate are arranged such that the basal face of the substrate faces the front face of the support plate and the depression of the latter is arranged laterally beyond the edge face. The process 306 of arranging the support plate and the substrate naturally necessitates that such elements are first provided. In other embodiments, steps of a process implementing a process corresponding to the process 306 of the embodiment of FIG. 3 may generally be executed following the completion of processes corresponding to the processes 301 and 302 of the embodiment of FIG. 3.

In process 307, the sensor tile is coupled to the substrate such that the back face of the sensor tile faces the interconnection face, the non-conductive film extends between the interconnection face and the back face, the copper-pillar interconnection element is arranged between the interconnection face and the back face, and the non-conductive film laterally surrounds the copper-pillar interconnection element. Because of this, an edge protrusion part of the non-conductive film, extending in the depression, is formed.

Thus, the process 307 of coupling the sensor tile to the substrate represents the actual formation of the superposed layer structure of the radiation sensor element. Proper execution of the process 307 of coupling the sensor tile to the substrate requires the completion of the processes 301, 302, 303, 304, 305 and 306. In other embodiments, steps of a process implementing a process corresponding to the process 307 of the embodiment of FIG. 3 may generally be executed following the completion of processes corresponding to the processes 301, 302, 303, 304, 305 and 306 of the embodiment of FIG. 3.

In other embodiments, a method for fabricating a radiation sensor element may comprise steps implementing processes corresponding to the processes 301, 302, 303, 304, 305, 306, 307 of the method 300 of the embodiment of FIG. 3.

Generally, a method for fabricating a radiation sensor element may comprise any number of processes or steps that are not disclosed herein in connection to the method 300 of the embodiment of FIG. 3.

For example, in an embodiment, a process of coupling the sensor tile to the substrate comprises a thermocompression bonding step. During such thermocompression step, a non-conductive film may flow or spread laterally, forming an edge protrusion part.

Herein, "thermocompression bonding" may refer to a process or process step, wherein a first metal element, e.g., a solder tip, is pressed onto a second metal element, e.g., a conductor pattern, and at least one of the first and the second metal elements is kept at a temperature substantially higher than 20° C., for example, at a temperature of at least 100° C., or at least 150° C., or at least 200° C.

In another embodiment, which may be in accordance with the preceding embodiment, a process of providing a non-conductive film comprises laminating the non-conductive film onto a sensor tile and/or a substrate. Laminating a non-conductive film may generally simplify fabrication of a radiation sensor element. In said embodiment, the process of laminating the non-conductive film onto a sensor tile and/or a substrate may or may not comprise a vacuum lamination step. Laminating a non-conductive film by vacuum lamination may generally increase fabrication yield and/or facilitate lamination of thin layers and/or lamination onto fine features, such as copper-pillar interconnection elements. As such, in said embodiment, said non-conductive film may be laminated onto a copper-pillar interconnection element.

Throughout this specification, "lamination" may refer to a process or process step, wherein an element is formed by bonding at least two generally sheet-shaped elements or parts together. Lamination may be achievable, for example, by application of heat, pressure, and/or adhesive(s).

Consequently, "vacuum lamination" may refer to a specific type of lamination effected at least partly by a fluid pressure difference. Additionally or alternatively, vacuum lamination may refer to a lamination process or step, wherein bonding is achieved at least partly in a vacuum environment. Such vacuum environment may have a pressure of less than 1000 pascal (Pa), or less than 100 Pa, or less than 10 Pa.

In another embodiment, which may be in accordance with the first of the two aforementioned embodiments, a process of providing a non-conductive film comprises dispensing the non-conductive film onto the sensor tile and/or the substrate in fluid, e.g., liquid, form. Dispensing a non-conductive film in fluid form may generally facilitate fabrication of a radiation sensor element. Such dispensing process may comprise, for example, a syringe-dispensing step, a spray-coating step, a spincoating step, and/or a dip-coating step. Further, in said embodiment, the non-conductive film may or may not be dispensed in fluid form between an interconnection face of said substrate and a back face of said sensor tile.

Throughout this disclosure, "providing" may refer to arranging available the element or part at issue. It may comprise forming, producing, or manufacturing the element or part at issue at least partly. Additionally or alternatively, providing may comprise arranging available an element or part which is ready-made or produced or manufactured beforehand. For example, when lamination is utilized in the process 307 of coupling the sensor tile to the substrate, a ready-made non-conductive film may be provided in process 305 and then positioned onto the substrate and/or the sensor tile before the coupling process. Alternatively, when providing a non-conductive film comprises dispensing the non-conductive film in fluid form, said providing actually constitutes forming, producing, or manufacturing the film.

Herein, a "step" may refer to a measure taken in order to achieve a pre-defined end result. Furthermore, a "process" may refer to a series of one or more steps, leading to said end result. As such, a process may be a single-step or a multi-step process. Additionally, a process may be divisible to a plurality of sub-processes, wherein individual sub-processes of such plurality of sub-processes may or may not share common steps.

The term "comprising" is used in this specification to mean including the feature(s) or act(s) followed thereafter, without excluding the presence of one or more additional features or acts. It will further be understood that reference to 'an' item refers to one or more of those items.

It is obvious to a person skilled in the art that with the advancement of technology, the basic idea of the invention may be implemented in various ways. The invention and its embodiments are thus not limited to the examples described above, instead they may vary within the scope of the claims.

It will be understood that any benefits and advantages described above may relate to one embodiment or may relate to several embodiments. The embodiments are not limited to those that solve any or all of the stated problems or those that have any or all of the stated benefits and advantages.

REFERENCE SIGNS 100 radiation sensor element
110 substrate
111 basal face
112 interconnection face
113 edge face
114 conductor trace
120 base plane
130 sensor tile
131 active material layer
136 back face
137 lateral face
140 copper-pillar interconnection element
141 solder tip
150 non-conductive film
151 edge protrusion part
160 support plate
161 front face
162 depression
163 rear face
170 read-out integrated circuit
171 first face
180 interconnection layer
300 method
301 providing a support plate
302 providing a substrate
303 providing a sensor tile
304 providing a copper-pillar interconnection element
305 providing a non-conductive film
306 arranging the support plate and the substrate
307 coupling the sensor tile to the substrate

The invention claimed is:

1. A radiation sensor element, comprising:
a support plate, having a front face, extending substantially along a base plane, defining a lateral extension of the radiation sensor element;
a substrate, having a basal face facing the front face, an interconnection face opposite the basal face, and an edge face connecting the basal face and the interconnection face;
a sensor tile, comprising an active material layer and having a back face facing the interconnection face;
a copper-pillar interconnection element between the interconnection face and the back face; and
a non-conductive film extending between the interconnection face and the back face and laterally surrounding the copper-pillar interconnection element;
wherein the front face comprises, laterally beyond the edge face, a depression extending in a thickness direction perpendicular to the base plane, and the non-conductive film comprises, laterally beyond the edge face, an edge protrusion part extending in the depression.

2. A radiation sensor element according to claim 1, wherein the depression comprises a pit, groove, and/or an edge profile.

3. A radiation sensor element according to claim 1, wherein the substrate comprises a flex circuit.

4. A radiation sensor element according to claim 1, wherein the copper-pillar interconnection element comprises a solder tip.

5. A radiation sensor element according to claim 4, wherein the solder tip comprises low-temperature solder.

6. A radiation sensor element according to claim 1, further comprising a read-out integrated circuit coupled with the substrate and in galvanic connection with the active material layer.

7. A radiation sensor element according to claim 6, wherein the support plate has a rear face opposite the front face, and the read-out integrated circuit has a first face facing the rear face.

8. A radiation sensor element according to claim 7, wherein the support plate comprises metal.

9. A radiation sensor element according to claim 1, wherein a ratio between a maximum depth $d_{max}$ of the depression, measured perpendicular to and from the base plane, and an average distance $d_{ave}$ between the interconnection face and the back face is at least 0.5, or at least 1, or at least 1.5.

10. A method for fabricating a radiation sensor element, the method comprising:
providing a support plate, having a front face, extending substantially along a base plane, defining a lateral extension of the radiation sensor element, the front face comprising a depression, extending in a thickness direction perpendicular to the base plane;
providing a substrate, having a basal face, an interconnection face opposite the basal face, and an edge face connecting the basal face and the interconnection face;
providing a sensor tile, comprising an active material layer and having a back face;
providing a copper-pillar interconnection element;
providing a non-conductive film;
arranging the support plate and the substrate such that the basal face faces the front face and the depression is arranged laterally beyond the edge face; and
coupling the sensor tile to the substrate such that the back face faces the interconnection face, the non-conductive film extends between the interconnection face and the back face, the copper-pillar interconnection element is arranged between the interconnection face and the back face, and the non-conductive film laterally surrounds the copper-pillar interconnection element, whereby an edge protrusion part of the non-conductive film, extending in the depression, is formed.

11. A method according to claim 10, wherein the process of coupling the sensor tile to the substrate comprises a thermocompression bonding step.

12. A method according claim 10, wherein the process of providing a non-conductive film comprises laminating the non-conductive film onto the sensor tile and/or the substrate.

13. A method according to claim 12, wherein the process of laminating the non-conductive film onto the sensor tile and/or the substrate comprises a vacuum lamination step.

14. A method according claim 10, wherein the process of providing a non-conductive film comprises dispensing the non-conductive film onto the sensor tile and/or the substrate in fluid form.

15. A method according to claim 10, the radiation sensor element comprising:
a support plate, having a front face, extending substantially along a base plane, defining a lateral extension of the radiation sensor element;
a substrate, having a basal face facing the front face, an interconnection face opposite the basal face, and an edge face connecting the basal face and the interconnection face;
a sensor tile, comprising an active material layer and having a back face facing the interconnection face;

a copper-pillar interconnection element between the interconnection face and the back face; and a non-conductive film extending between the interconnection face and the back face and laterally surrounding the copper-pillar interconnection element;

wherein the front face comprises, laterally beyond the edge face, a depression extending in a thickness direction perpendicular to the base plane, and the non-conductive film comprises, laterally beyond the edge face, an edge protrusion part extending in the depression.

* * * * *